United States Patent
Wu

(10) Patent No.: US 7,102,399 B2
(45) Date of Patent: Sep. 5, 2006

(54) LOW-NOISE FREQUENCY DIVIDER

(75) Inventor: Stephen Wu, Fountain Valley, CA (US)

(73) Assignee: Broadcom Corporation, Irvine, CA (US)

( * ) Notice: Subject to any disclaimer, the term of this patent is extended or adjusted under 35 U.S.C. 154(b) by 70 days.

(21) Appl. No.: 10/815,162

(22) Filed: Mar. 31, 2004

(65) Prior Publication Data
US 2005/0219000 A1    Oct. 6, 2005

(51) Int. Cl.
*H03L 7/00*  (2006.01)

(52) U.S. Cl. .................. 327/156; 327/157; 327/117

(58) Field of Classification Search .............. None
See application file for complete search history.

(56) References Cited

U.S. PATENT DOCUMENTS

| | | | | |
|---|---|---|---|---|
| 4,184,068 A | * | 1/1980 | Washburn ................... | 377/44 |
| 4,864,634 A | * | 9/1989 | Nakagawa et al. .......... | 455/76 |
| 4,965,531 A | * | 10/1990 | Riley ........................ | 331/1 A |
| 6,424,192 B1 | * | 7/2002 | Lee et al. ................... | 327/156 |
| 6,707,305 B1 | * | 3/2004 | Johnson et al. ............ | 324/542 |
| 2004/0196940 A1 | * | 10/2004 | Chien ........................ | 375/376 |

* cited by examiner

*Primary Examiner*—Tuan T. Lam
*Assistant Examiner*—Hiep Nguyen
(74) *Attorney, Agent, or Firm*—Garlick Harrison & Markison; James A. Harrison

(57) ABSTRACT

A multi-modulus divider for producing a low-noise divided output, wherein one embodiment comprises a low-noise frequency divider comprising a pulse-swallow configured divider module and first, second, and third latching blocks. The pulse-swallow configured divider module produces a pre-scaled divider output and a divided oscillation. The divided oscillation is sequentially latched by the latching blocks, wherein the divided oscillation and pre-scaled divider output, coupled as clocks to the latching blocks, resynchronize the divided oscillation to substantially eliminate noise. The first and second latching blocks are biased by a first bias signal and the third latching block is biased by a second bias signal wherein the second bias signal is larger than the first bias signal. Each latching block includes an output load device wherein the impedance of the third latching block is smaller than the impedance of the other output load devices.

31 Claims, 12 Drawing Sheets phase-locked loop 100 communications network 10

FIG. 2 wireless communication device phase-locked loop 100 pulse-swallow configured divider module 116

PLL 100 with buffer latching block buffer 192 timing graph timing diagrams method for producing a low phase noise divided oscillation method for producing a low phase noise divided oscillation method for producing a low phase noise divided oscillation

LOW-NOISE FREQUENCY DIVIDER

BACKGROUND

1. Technical Field

The present invention relates to wireless communications and, more particularly, wireless local area networks.

2. Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards, including, but not limited to, IEEE 802.11, Bluetooth, Advanced Mobile Phone Services (AMPS), digital AMPS, Global System for Mobile Communications (GSM), Code Division Multiple Access (CDMA), Local Multipoint Distribution Systems (LMDS), Multipoint Multichannel Distribution Services (MMDS), and/or variations thereof.

Depending on the type of wireless communication system, a wireless communication device, such as a cellular telephone, two-way radio, personal digital assistant (PDA), personal computer (PC), laptop computer, home entertainment equipment, etc., communicates directly or indirectly with other wireless communication devices. For direct communications (also known as point-to-point communications), the participating wireless communication devices tune their receivers and transmitters to the same channel or channels (e.g., one of a plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via a Public Switched Telephone Network (PSTN), via the Internet, and/or via some other wide area network.

Each wireless communication device includes a built-in radio transceiver (i.e., receiver and transmitter) or is coupled to an associated radio transceiver (e.g., a station for in-home and/or in-building wireless communication networks, RF modem, etc.). As is known, the transmitter includes a data modulation stage, one or more intermediate frequency stages, and a power amplifier. The data modulation stage converts raw data into baseband signals in accordance with the particular wireless communication standard. The one or more intermediate frequency stages mix the baseband signals with one or more local oscillations to produce RF signals. The power amplifier amplifies the RF signals prior to transmission via an antenna.

As is also known, the receiver is coupled to the antenna and includes a low noise amplifier, one or more intermediate frequency stages, a filtering stage, and a data recovery stage (demodulator). The low noise amplifier receives an inbound RF signal via the antenna and amplifies it. The one or more intermediate frequency stages mix the amplified RF signal with one or more local oscillations to convert the amplified RF signal into a baseband signal or an intermediate frequency (IF) signal. As used herein, the term "low IF" refers to both baseband and intermediate frequency signals. A filtering stage filters the low IF signals to attenuate unwanted out of band signals to produce a filtered signal. The data recovery stage recovers raw data from the filtered signal in accordance with the particular wireless communication standard. Alternate designs being pursued at this time further include direct conversion radios that produce a direct frequency conversion often in a plurality of mixing steps or stages.

Phase locked loops (PLLs) are becoming increasingly popular in integrated wireless transceivers as components for frequency generation and modulation. PLLs are typically used for one of a variety of functions, including frequency translation to up-convert a baseband (BB) frequency to an intermediate frequency (IF) or to one of a BB frequency or IF to RF prior to amplification by a power amplifier and transmission (propagation). PLLs allow for a high degree of integration and, when implemented with the appropriate amount of programmability, can form a main building block for modulators that operate over a wide range of frequencies. Thus, it is desirable to form the PLL to have low phase noise. Typically, a baseband processor produces baseband digital data that is converted to a continuous waveform signal by a digital-to-analog converter (DAC). The continuous waveform signal is a BB frequency signal that requires up-converting to IF and then RF.

A class of PLL-based transmitters, known as translational loops, has become particularly popular. Briefly, in a translational loop, the desired modulated spectrum is generated as some low IF or baseband signal and then is translated to the desired RF using a PLL. In applications with non-constant envelope modulation, a parallel path for amplitude variation modulates the output power amplifier to generate the desired amplitude variation.

A qualitative description of the operation of the translational loop is as follows. The sum of the mixing products of the baseband I & Q components with down-converted RF output I & Q components are low-pass filtered to generate a 26 MHz sinusoid whose excess phase component equals the difference between the desired baseband phase signal and the RF output phase signal. The 26 MHz IF is extracted by a phase-frequency detector (PFD) whose output is the phase error signal. As in any other properly designed PLL, the closed loop action of the loop causes the error signal to approach zero; hence, the phase of the RF output tracks the phase of the baseband signal, as desired.. However, phase noise can generate an additional PFD error term that modulates the VCO frequency in the PLL thereby causing an increasing phase error between the RF output phase error and the desired baseband phase signal. Thus, a need exists for a low-noise frequency divider in a PLL that provides a required output signal swing while maintaining low phase noise.

SUMMARY OF THE INVENTION

A phase locked loop comprises a phase-frequency detector coupled to receive a reference signal, wherein the phase-frequency detector produces a phase control signal, a charge pump for producing a voltage controlled oscillator (VCO) control signal based upon the phase control signal, a VCO for producing an oscillation having a frequency based upon the VCO control signal, and a low-noise divider for producing a low phase noise divided oscillation.

The low noise divider further includes a pulse-swallow configured divider comprising a pre-scaled divider block and first and second divider blocks wherein the pre-scaled divider block is biased by a first bias signal and wherein the first and second dividers are biased for digital operation. The pre-scaled divider block produces a pre-scaled divider output based upon the oscillation. The first divider block produces a divided oscillation based upon the pre-scaled divider output that is operably coupled to a first latching block.

The first latching block latches the divided oscillation based upon the pre-scaled divider output as a clock to produce a first latched signal. A second latching block latches the first latched signal based upon the VCO oscillation as a clock to produce a second latched signal. A third latching block latches the second latched signal based upon the VCO oscillation as a clock to produce a third latched signal, wherein the third latched signal is the low phase noise divided oscillation and is produced to the phase-frequency detector for comparison to a reference signal.

The first and second latching blocks are biased by the first bias signal and the third latching block is biased by a second bias signal wherein the second bias signal is greater in magnitude than the first bias signal. The first, second, and third latching blocks each contain an output load device wherein the output load device of the third latching block has a smaller impedance than an impedance of the output load devices of the first and second latching blocks. The impedance of the third latching block output load device is selected to produce a specified voltage swing and to minimize thermal and flicker noise. The impedance of the first and second latching block output load devices are selected to produce a desired signal level to the third latching block.

In an alternate embodiment of the PLL, a buffer is operably coupled between the VCO output and the low-noise divider input wherein the buffer produces a buffered oscillation to the pulse-swallow configured divider module in the low-noise divider. The buffer decouples the VCO output from switching noise generated by the pulse-swallow configured divider so that the VCO oscillation produced to the third latching block is substantially noise free. A pre-scaled divider in the pulse-swallow configured divider module produces a pre-scaled divider output based upon the buffered oscillation produced by the buffer. In this embodiment, the third latching block is clocked by the VCO oscillation and the second latching block is clocked by the buffered oscillation.

While the described embodiment of the present invention is directed to a pulse-swallow divider, the concepts presented are applicable to any multi-modulus divider. The above-referenced description of the summary of the invention captures some, but not all, of the various aspects of the present invention. The claims are directed to some of the various other embodiments of the subject matter towards which the present invention is directed. In addition, other aspects, advantages and novel features of the invention will become apparent from the following detailed description of the invention when considered in conjunction with the accompanying drawings.

BRIEF DESCRIPTION OF THE DRAWINGS

A better understanding of the present invention can be obtained when the following detailed description of the preferred embodiment is considered with the following drawings, in which.

DETAILED DESCRIPTION OF THE DRAWINGS

Figure 1:
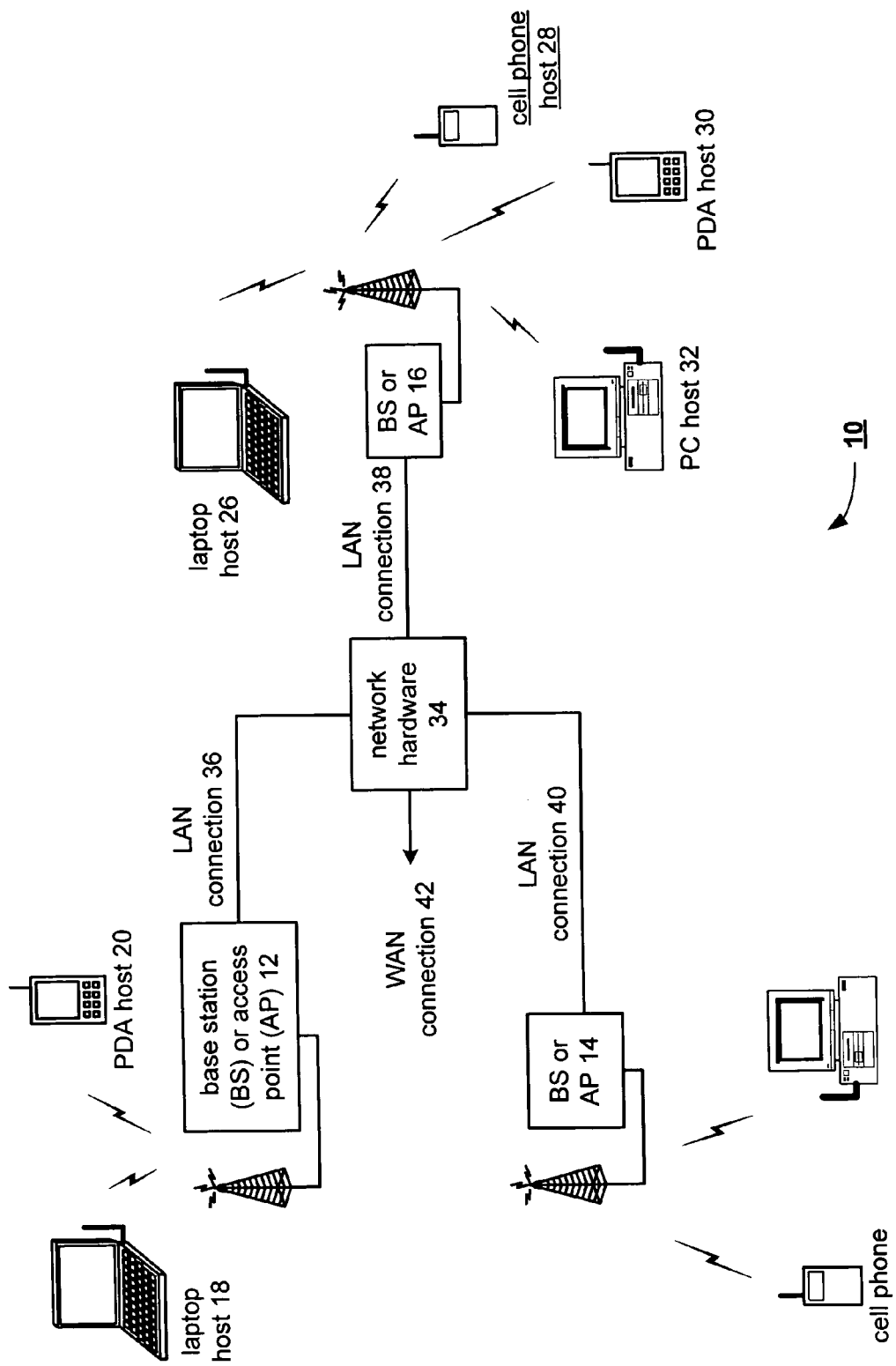
FIG. 1 is a functional block diagram illustrating a communication system that includes a plurality of base stations or access points (APs), a plurality of wireless communication devices and a network hardware component.

FIG. 1 is a functional block diagram illustrating a communication system 10 that includes a plurality of base stations or access points (APs) 12–16, a plurality of wireless communication devices 18–32 and a network hardware component 34. The wireless communication devices 18–32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2.

The base stations or access points 12–16 are operably coupled to the network hardware component 34 via local area network (LAN) connections 36, 38 and 40. The network hardware component 34, which may be a router, switch, bridge, modem, system controller, etc., provides a wide area network (WAN) connection 42 for the communication system 10. Each of the base stations or access points 12–16 has an associated antenna or antenna array to communicate with the wireless communication devices in its area. Typically, the wireless communication devices 18–32 register with the particular base station or access points 12–16 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio and each radio requires a transceiver configured to operate at a specified frequency or frequency channel. The specified frequency is maintained by radio transceiver circuitry including a phase-locked loop incorporating the method and apparatus of the present invention to maintain a low phase noise signal within the phase-locked loop.

Figure 2:
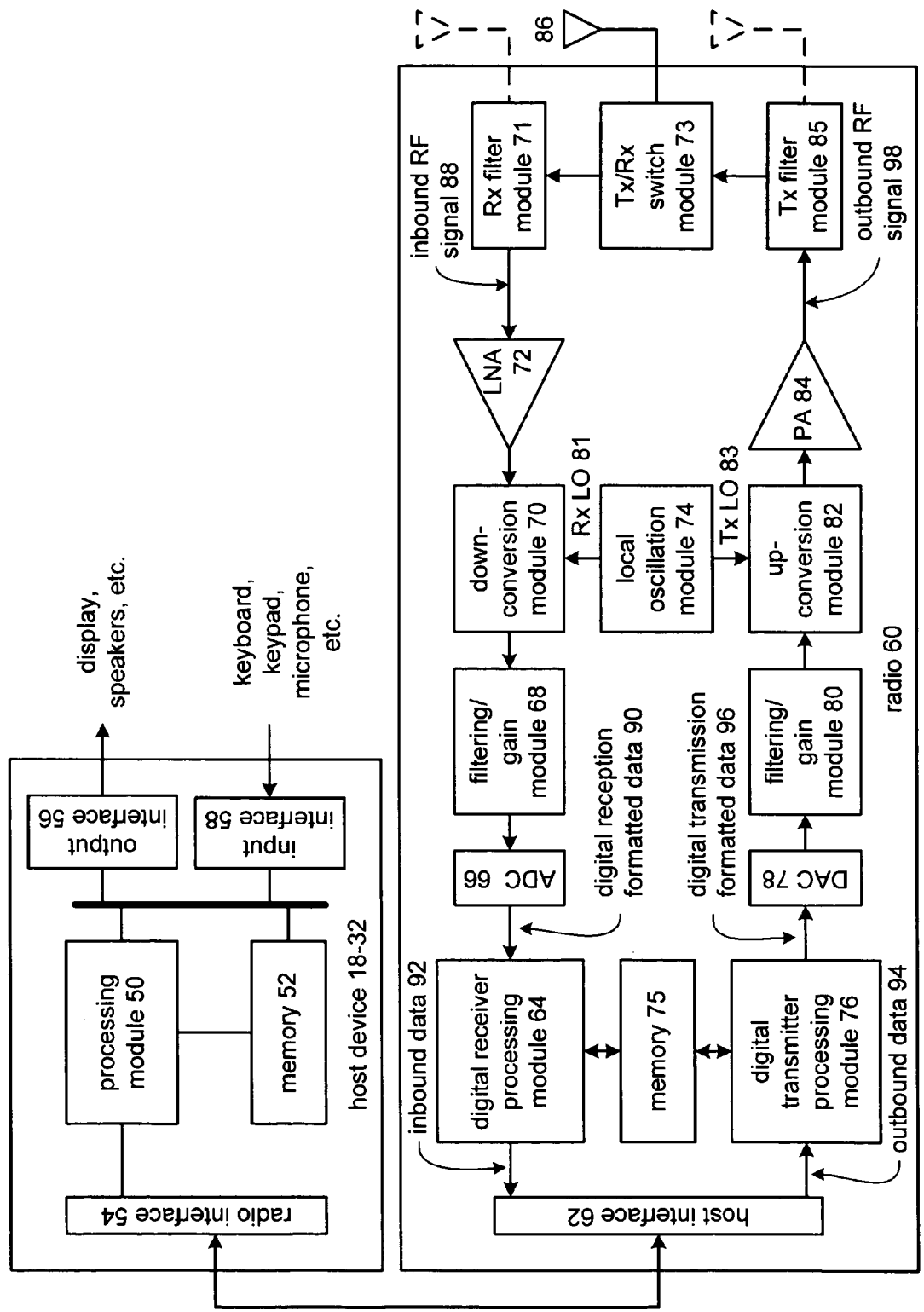
FIG. 2 is a schematic block diagram illustrating a wireless communication device as a host device and an associated radio.

FIG. 2 is a schematic block diagram illustrating a wireless communication device 18–32 as a host device and an associated radio 60. For cellular telephone hosts, the radio 60 is a built-in component. For personal digital assistant hosts, laptop hosts, and/or personal computer hosts, the radio 60 may be built-in or an externally coupled component.

As illustrated, the host wireless communication device 18–32 includes a processing module 50, a memory 52, a radio interface 54, an input interface 58 and an output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output device such as a display, monitor, speakers, etc., such that the received data may be displayed. The radio interface 54 also provides data from the processing module 50 to the radio 60. The processing module 50 may receive the outbound data from an input device such as a keyboard, keypad, microphone, etc., via the input interface 58 or generate the data itself. For data received via the input interface 58, the processing module 50 may perform a corresponding host function on the data and/or route it to the radio 60 via the radio interface 54.

Radio 60 includes a host interface 62, a digital receiver processing module 64, an analog-to-digital converter 66, a filtering/gain module 68, a down-conversion module 70, a low noise amplifier 72, a receiver filter module 71, a transmitter/receiver (Tx/Rx) switch module 73, a local oscillation module 74, a memory 75, a digital transmitter processing module 76, a digital-to-analog converter 78, a filtering/gain module 80, an IF mixing up-conversion module 82, a power amplifier 84, a transmitter filter module 85, and an antenna 86. The antenna 86 is shared by the transmit and receive paths as regulated by the Tx/Rx switch module 73. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, demodulation, constellation demapping, decoding, and/or descrambling. The digital transmitter functions include, but are not limited to, scrambling, encoding, constellation mapping, and/or modulation. The digital receiver and transmitter processing modules 64 and 76, respectively, may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the digital receiver processing module 64 and/or the digital transmitter processing module 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. The memory 75 stores, and the digital receiver processing module 64 and/or the digital transmitter processing module 76 executes, operational instructions corresponding to at least some of the functions illustrated herein.

In operation, the radio 60 receives outbound data 94 from the host wireless communication device 18–32 via the host interface 62. The host interface 62 routes the outbound data 94 to the digital transmitter processing module 76, which processes the outbound data 94 in accordance with a particular wireless communication standard (e.g., IEEE 802.11a, IEEE 802.11b, Bluetooth, etc.) to produce digital transmission formatted data 96. The digital transmission formatted data 96 will be a digital baseband signal or a digital low IF signal, where the low IF typically will be in the frequency range of 100 KHz to a few Mega-Hertz.

The digital-to-analog converter 78 converts the digital transmission formatted data 96 from the digital domain to the analog domain. The filtering/gain module 80 filters and/or adjusts the gain of the analog baseband signal prior to providing it to the up-conversion module 82. The up-conversion module 82 directly converts the analog baseband signal, or low IF signal, into an RF signal based on a transmitter local oscillation signal 83 provided by local oscillation module 74. Local oscillation module 74 includes a multi-stage mixer and, in one embodiment of the invention, includes a low-noise phase-locked loop to produce low phase noise signals Rx LO 81 and Tx LO 83. The power amplifier 84 amplifies the RF signal to produce an outbound RF signal 98, which is filtered by the transmitter filter module 85. The antenna 86 transmits the outbound RF signal 98 to a targeted device such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the receiver filter module 71 via the Tx/Rx switch module 73, where the Rx filter module 71 bandpass filters the inbound RF signal 88. The Rx filter module 71 provides the filtered RF signal to low noise amplifier 72, which amplifies the inbound RF signal 88 to produce an amplified inbound RF signal. The low noise amplifier 72 provides the amplified inbound RF signal to the down-conversion module 70, which directly converts the amplified inbound RF signal into an inbound low IF signal or baseband signal based on a receiver local oscillation signal 81 provided by local oscillation module 74. Local oscillation module 74 is, in one embodiment of the invention, a multi-stage mixer as described herein. The down-conversion module 70 provides the inbound low IF signal or baseband signal to the filtering/gain module 68. The filtering/gain module 68 may be implemented in accordance with the teachings of the present invention to filter and/or attenuate the inbound low IF signal or the inbound baseband signal to produce a filtered inbound signal.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host wireless communication device 18–32 via the radio interface 54.

As one of average skill in the art will appreciate, the wireless communication device of FIG. 2 may be implemented using one or more integrated circuits. For example, the host device may be implemented on a first integrated circuit, while the digital receiver processing module 64, the digital transmitter processing module 76 and memory 75 are implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of host device 18–32 and the digital receiver processing module 64 and the digital transmitter processing module 76 of radio 60 may be a common processing device implemented on a single integrated circuit. Further, memory 52 and memory 75 may be implemented on a single integrated circuit and/or on the same integrated circuit as the common processing modules of processing module 50, the digital receiver processing module 64, and the digital transmitter processing module 76.

Figure 3:
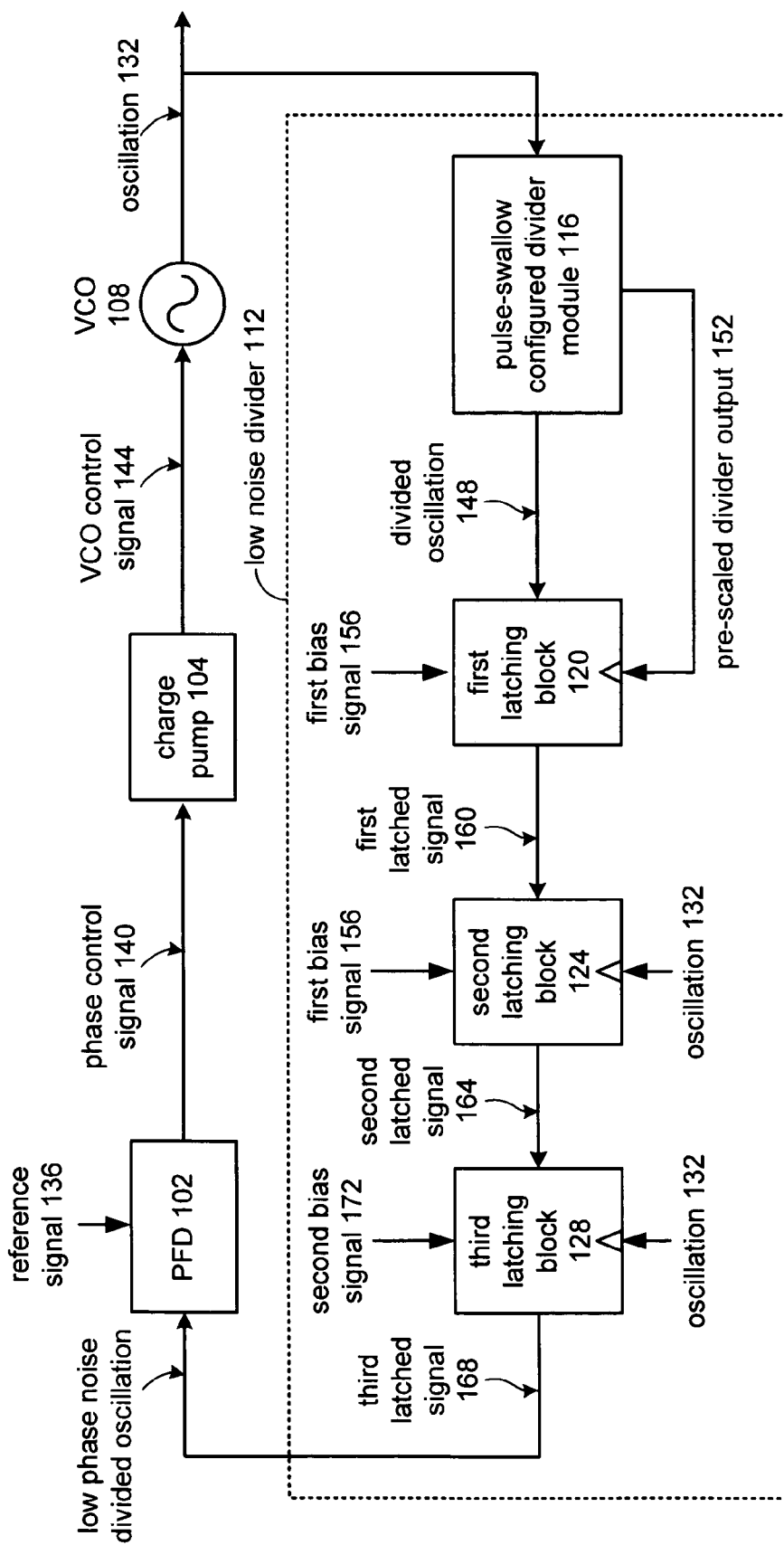
FIG. 3 is a functional block diagram of a phase-locked loop according to one embodiment of the present invention.

FIG. 3 is a functional block diagram of a phase locked loop according to one embodiment of the present invention. The phase-locked loop (PLL) 100 includes a phase frequency detector (PFD) 102, a charge pump 104, a voltage controlled oscillator (VCO) 108 and a low noise divider 112 that produces a low phase noise divided oscillation. Low noise divider 112 includes a pulse-swallow configured divider module 116, a first latching block 120, a second latching block 124, and a third latching block 128, all connected in series.

As is known to one of average skill in the art, a PLL maintains a VCO oscillation at a specified frequency by dividing the VCO oscillation by a specified number wherein the output of the divider is substantially equal to a reference signal. Typically prior art PLLs, however, introduced levels of phase noise that are unacceptable for some applications. As such, PLL 100 herein produces the VCO oscillation but is advantageous in that PLL 100 provides a low noise oscillation based in part on a low phase noise divided oscillation produced in a feedback loop. The PFD 102 receives reference signal 136 from a reference source and compares it to a low phase noise divided oscillation produced from low noise divider 112. As is known by those of average skill in the art, a reference signal source typically comprises a crystal or other clock source. The PFD 102 produces a phase control signal 140 that is proportional to the phase and/or frequency difference between the low phase noise divided oscillation and reference signal 136. Phase control signal 140 is produced to charge pump 104 and loop filter 105, which in turn, produces VCO control signal 144. VCO 108 is coupled to receive VCO control signal 144 and produces an oscillation 132 that is based upon phase control signal 140 which, in turn, is based upon a difference between reference signal 136 and low phase noise divided oscillation (third latched signal 168). The system of FIG. 3 adjusts VCO 108 frequency of oscillation to substantially reduce the phase and/or frequency difference between the low phase noise divided oscillation and reference signal 136. Generally, low noise divider 112 divides oscillation 132 received from VCO 108 by the specified number to produce the low phase noise divided oscillation. A plurality of series coupled latching blocks sequentially latches the divided oscillation based on the VCO oscillation as a clock to substantially eliminate phase noise produced from the dividing circuits of low noise divider 112. To further reduce phase noise, the size and biasing of the series coupled latching blocks are formed to substantially reduce phase noise contributions from flicker noise, substrate noise, and thermal noise.

With reference to low noise divider 112, pulse-swallow configured divider module 116 receives oscillation 132 generated by VCO 108 and produces a divided oscillation 148 and a pre-scaled divider output 152. Pulse-swallow configured divider module 116 produces pre-scaled divider output 152 which is oscillation 132 divided by N or N+1 based on an internal modulus control signal coupled to a pre-scaled divider (not shown). Module 116 further provides divided oscillation 148 that represents pre-scaled divider output 152 divided by a program counter value and a swallow counter value. In one embodiment of the present invention, the pre-scaled divider value is one of 15 or 16, and the program counter value is 159. Operation of pulse-swallow configured divider module 116 will be discussed with respect to FIG. 4.

Continuing with the description of FIG. 3, divided oscillation 148 is operably coupled to first latching block 120 wherein divided oscillation 148 is clocked into first latching block 120 by pre-scaled divider output 152. First latching block 120 is biased by a first bias signal 156 wherein first bias signal 156 is a relatively small bias signal to control power dissipation in first latching block 120 and second latching block 124. Based on pre-scaled divider output 152 as a clock, first latching block 120 produces a first latched signal 160 that is operatively coupled to second latching block 124. Second latching block 124 receives oscillation 132 as a clock and further receives first bias signal 156, wherein second latching block 124 produces a second latched signal 164. Third latching block 128 is operably coupled to receive second latched signal 164, and based on oscillation 132 as a clock, produces a third latched signal 168 as a low phase noise divided oscillation that is operably coupled to PFD 102.

First and second latching blocks 120 and 124, respectively, operably coupled to receive first bias signal 156, are optimized to minimize silicon area and power dissipation while third latching block 126, operably coupled to receive second bias signal 172, is formed as a relatively large silicon area device to provide a larger power dissipation when conducting a relatively large current produced by second bias signal 172 to optimize thermal and flicker noise. The relatively large current and relatively small impedance value of the output load device of the third latching block produces a specified signal swing for PFD 102 and a faster transition time thereby reducing the susceptibility to noise coupling. The relatively large current produced by second bias signal 172 reduces the requirement for a high impedance value of the output load device, which is typically a resistive element, thus reducing the thermal noise contributed by the resistive device. The relatively large current produced by second bias signal 172 substantially reduces the flicker noise in third latched signal 168. As is known to one of average skill in the art, small semiconductor devices have greater flicker noise than that of larger semiconductor devices. As is also known, a large resistive element has more thermal noise than a smaller resistive element. Thus, the phase noise contribution by third latching block 128 is minimized by having relatively large devices internal to third latching block 128 and a relatively large current coupled to a relatively small resistive output load device (not shown) thereby substantially reducing the phase noise.

The addition of first latching block 120, second latching block 124, and third latching block 128, to sequentially latch divided oscillation 148 produced from module 116, and further clocked by pre-scaled divider output 152 and oscillation 132, functions to control the timing margin, i.e., the setup and hold time, required for first, second, and third latching blocks 120–128 thereby minimizing the phase noise contribution that would occur when a latched input signal arrives at substantially the same time as the clock signal. When the latching block input signal arrives at substantially the same time as the clocking signal, the rise time required for the latching block to charge from a first value to a second value increases. During this increased rise time, noise, such as flicker noise, substrate noise, and power supply noise is coupled to the output.

These noise sources, if coupled to the output of the third latching block, will be coupled to PFD 102, effectively modulating phase control signal 140 thereby effectively modulating the frequency of oscillation 132 produced by VCO 108. This modulation produces, in the time domain, a frequency jitter into oscillation 132 that is further coupled to components receiving oscillation 132, such as down-conversion module 70 and up-conversion module 82 of FIG. 2. As is known to one of average skill in the art, the timing jitter present in oscillation 132 contributes to inaccurate clock and/or data recovery circuits thereby introducing errors in the recovered clock and/or data and further increasing a bit error rate. One embodiment of the present invention employs first, second, and third latching blocks to resynchronize the divided oscillations to substantially reduce the phase noise contributions from the latches and dividers of low noise divider 112.

While the described embodiment is specific to a pulse-swallow configured divider configuration, the inventive concept is applicable to any multi-modulus divider. For example, if first latching block 120 and pulse-swallow configured divider 116 are replaced with a multi-modulus divider module as illustrated by line 117, FIG. 3 functions as a low phase-noise multi-modulus divider.

Figure 4:
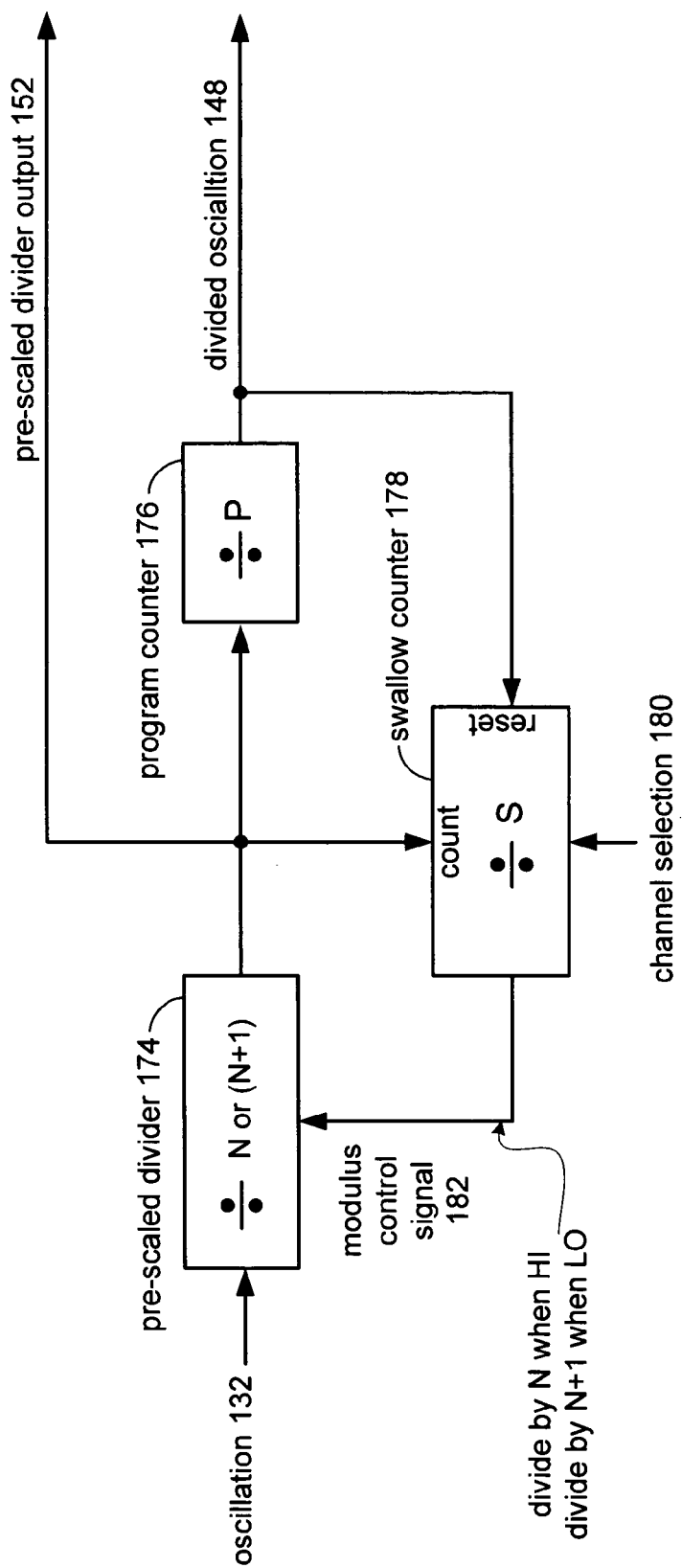
FIG. 4 is a functional block diagram of a pulse-swallow configured divider.

FIG. 4 is a functional block diagram of a pulse-swallow configured divider. Pulse-swallow configured divider 116 includes a pre-scaled divider 174, a first divider (program counter 176), and a second divider (swallow counter 178). Pre-scaled divider 174 is formed as an analog device to allow faster switching of oscillation 132. Therefore, pre-scaled divider 174 receives a first bias signal (not shown) to place the components comprising the divider into the saturation region for fast response. Conversely, the first and second dividers are digital devices and are, therefore, biased for digital operation. As is known to one of average skill in the art, digital devices do not require static DC bias current since substantially all the current is switching current, thus digital biasing comprises load devices and current sources capable of providing the switching current to produce a specified output voltage swing.

Pre-scaled divider 174 receives oscillation 132 and divides the oscillation by either N or N+1, wherein N is an integer, based on the logic level of modulus control signal 182 received from swallow counter 178. The output of pre-scaled divider 174 (pre-scaled divider output 152) is produced to program counter 176, swallow counter 178, and to first latching block 120 of FIG. 3. Program counter 176 divides pre-scaled divider output 152 by P, wherein P is an integer that is larger than S to produce divided oscillation 148. Divided oscillation 148 is coupled to a reset input of swallow counter 178, and to first latching block 120 of FIG. 3. Swallow counter 178 divides pre-scaled divider output 152 by S, wherein S is an integer representing a desired channel number in a specified frequency band. The integer S is typically larger than N but less than P. Divided oscillation 148 coupled to the reset input of swallow counter 178 resets the swallow counter to zero causing a change in modulus control signal 182 which changes the modulus of the pre-scaled divider to either N or N+1. When swallow counter 178 counts up to S and resets, it switches pre-scaled divider 174 from divide by N or N+1. Each time swallow counter 178 resets and switches pre-scaled divider 174 from divide by N+1 back to divide by N, the swallow counter effectively deletes or swallows a pulse of pre-scaled divider output 152. Divided oscillation 148, coupled to first latching block 120 of FIG. 3, consists of S cycles of oscillation 132 divided by N+1 and (P−S) cycles of oscillation 132 divided by N. In one embodiment of the present invention, N is 15, P is 159, and channel select 180 is 0 to 127. When, for example, channel select is set to 127, pre-scaled divider 174 divides by 16 (N+1) for 127 cycles of pre-scaled divider output 152 then divides by 15 (N) for 32 (P−S) pulses of pre-scaled divider output 152. The use of a relatively small divider ratio (N and N+1) in pre-scaled divider 174 reduces the oscillation frequency without excessive power dissipation.

Figure 5:
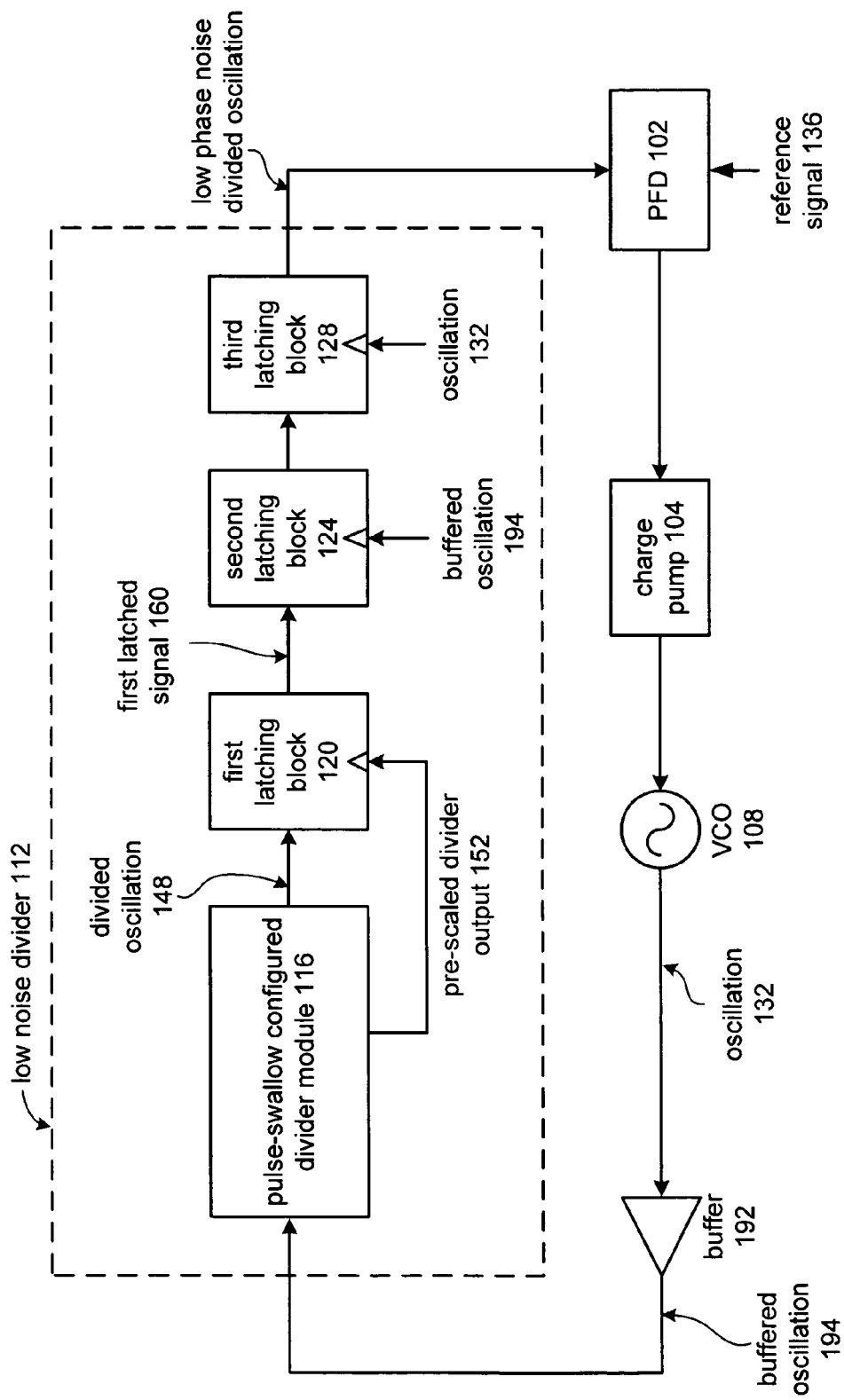
FIG. 5 is a functional block diagram of a phase-locked loop according to an alternate embodiment of the present invention.

FIG. 5 is a functional block diagram of a phase-locked loop according to an alternate embodiment of the present invention. In this embodiment, a buffer 192 is inserted between VCO 108 and low noise divider 112 to reduce the output loading on VCO 108 due to the dividers and latches within low noise divider 112. As can be seen in FIG. 5, a buffered oscillation 194 produced by buffer 192 is operably coupled to pulse-swallow configured divider module 116 and second latching block 124. The isolation between VCO 108 and low noise divider 112 provided by buffer 192 results in a reduction in the parasitic and substrate coupling that contributes to phase noise in the phase-locked loop. Because buffer 192 is formed to have a low input capacitance, VCO 108 only drives the low input capacitance thereby substantially reducing the loading on VCO 108.

Buffered oscillation 194 produced by buffer 192 is operably coupled to second latching block 124 as a clock to time second latching block 124 as was discussed with respect to FIG. 4. The additional propagation delay due to buffer 192 ensures that first latched signal 160 will not arrive at second latching block 124 at the same time as buffered oscillation 188. As was previously mentioned with respect to FIG. 4, simultaneous arrival of the latched input and the latch clocking signal increases phase noise at the VCO output. Pulse-swallow configured divider module 116, first latching block 120, second latching block 124, and third latching block 128, function as was previously described with respect to FIG. 3.

Figure 6:
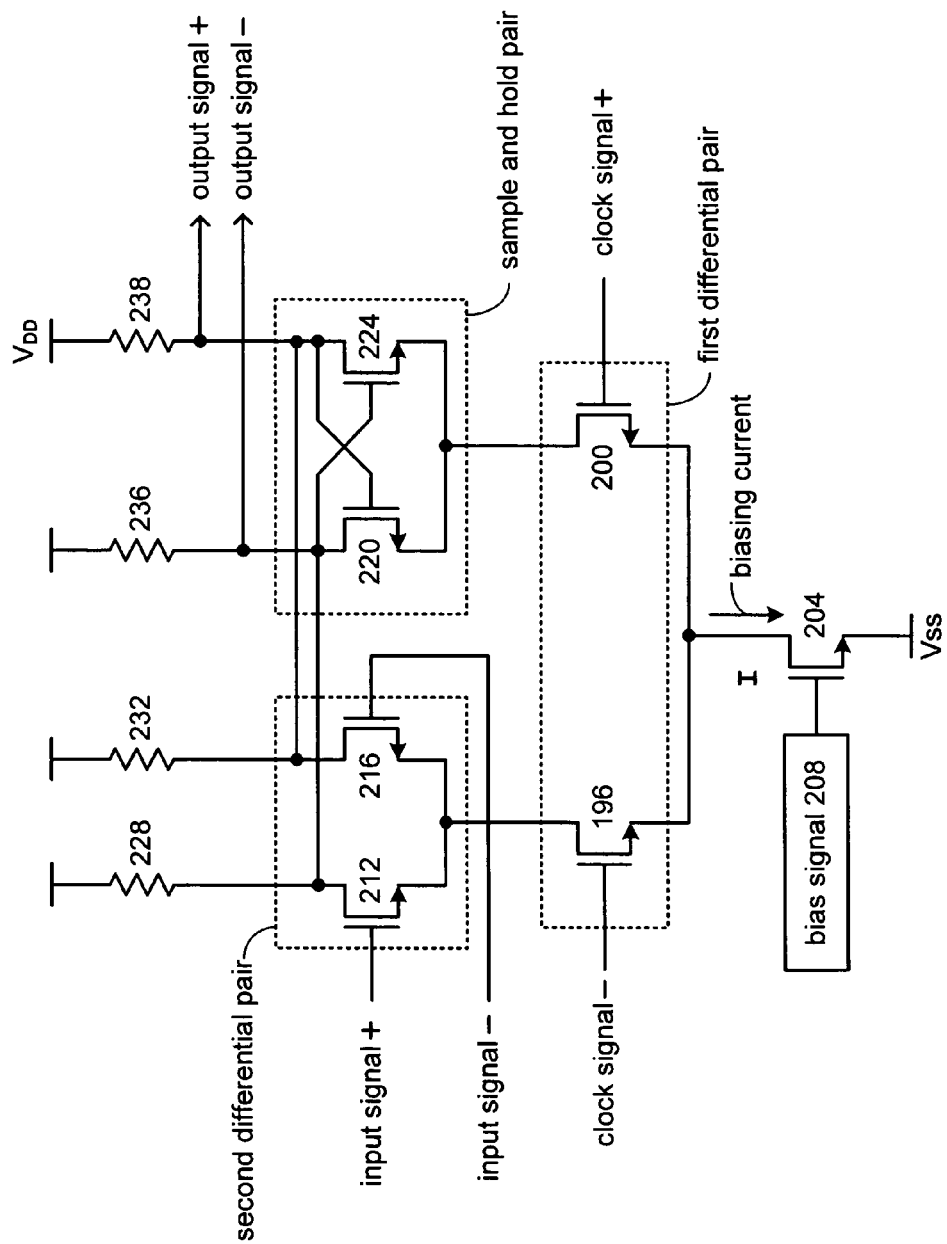
FIG. 6 is a schematic block diagram of a latching block according to one embodiment of the present invention.

FIG. 6 is a schematic block diagram of a latching block according to one embodiment of the present invention. The latching block of FIG. 6 is an exemplary embodiment that may be used for any one or all of the first, second, and third latching blocks. The latching block is a flip-flop comprising two latches coupled in series. As can be seen, the first latch comprises a first differential pair comprising transistor 196 and transistor 200 having commonly coupled sources coupled to a drain of a bias transistor 204. Bias transistor 204 receives a bias signal 208 on a gate that biases transistor 204 into a saturation region of operation thereby providing a specified biasing current to transistors 196 and 200. The drain of transistor 196 is operably coupled to commonly coupled sources of a second differential pair comprising transistor 212 and transistor 216. A gate of transistor 212 is operably coupled to receive a positive phase of an input signal, while transistor 216 is operably coupled to receive a negative phase of the input signal. The input signal comprises one of divided oscillation 148, first latched signal 160, or second latched signal 164, as was discussed with respect to FIG. 3. The drains of transistors 212 and 216 are operably coupled to output load devices 228 and 232, respectively. Output load devices 228 and 232, and output load devices 236 and 238 provide voltage swing proportional to the current produced by the second differential pair and the sample and hold pair, respectively, and the resistive value of the output load devices.

A drain of transistor 200 of the first differential pair is operatively coupled to commonly coupled sources of a sample and hold pair comprising transistors 220 and 224. A drain of transistor 220 is operatively coupled to a gate of transistor 224, while a drain of transistor 224 is operatively coupled to a gate of transistor 220. As can be seen in FIG. 6, the cross-coupled gates of transistor 220 and transistor 224 function to hold the voltage produced by the second differential pair during a positive transition of the clock signal coupled to the gate of transistor 200. The clock signal coupled to the gates of transistor 196 and transistor 200 comprises one of oscillation 132, pre-scaled divider output 152, or buffered oscillation 194. The positive transition of the clock signal coupled to the gate of transistor 200 biases the transistor into operation thereby turning on transistor pair 220 and 224 which holds the voltage values of the second differential pair as input voltages for the second latch input. When the latching block shown in FIG. 6 is configured as third latching block 128, the transistor devices are formed much larger than are the transistors formed in either second latching block 124 or first latching block 120. Accordingly, bias signals 208 and 209 are formed to provide a much higher current to provide the required voltage swing across the output load devices, namely, output load devices 228, 232, 236, 238, 229, 233, 237, and 239, which are specified to have a relatively small resistive value, thus achieving the desired voltage swing required as an input to the phase frequency detector (PFD 102 of FIG. 3) while minimizing thermal noise in the output load devices and further minimizing the flicker noise in the transistors. The small resistive value also reduces the transition time for a given capacitive load.

A second latch comprises a third differential pair including transistors 197 and 201, a fourth differential pair 241 including transistors 213 and 217, a bias transistor 205 operably coupled to receive a bias signal 209, a second sample and hold pair 243 including transistors 221 and 225, and output load devices 229, 233, 237, and 239. The second latch is operably coupled to the output of the first latch. The second latch, being functionally identical to the first latch, produces the output signal + and output signal − as one of first latched signal 160, second latched signal 164, or third latched signal 168.

Figure 7:
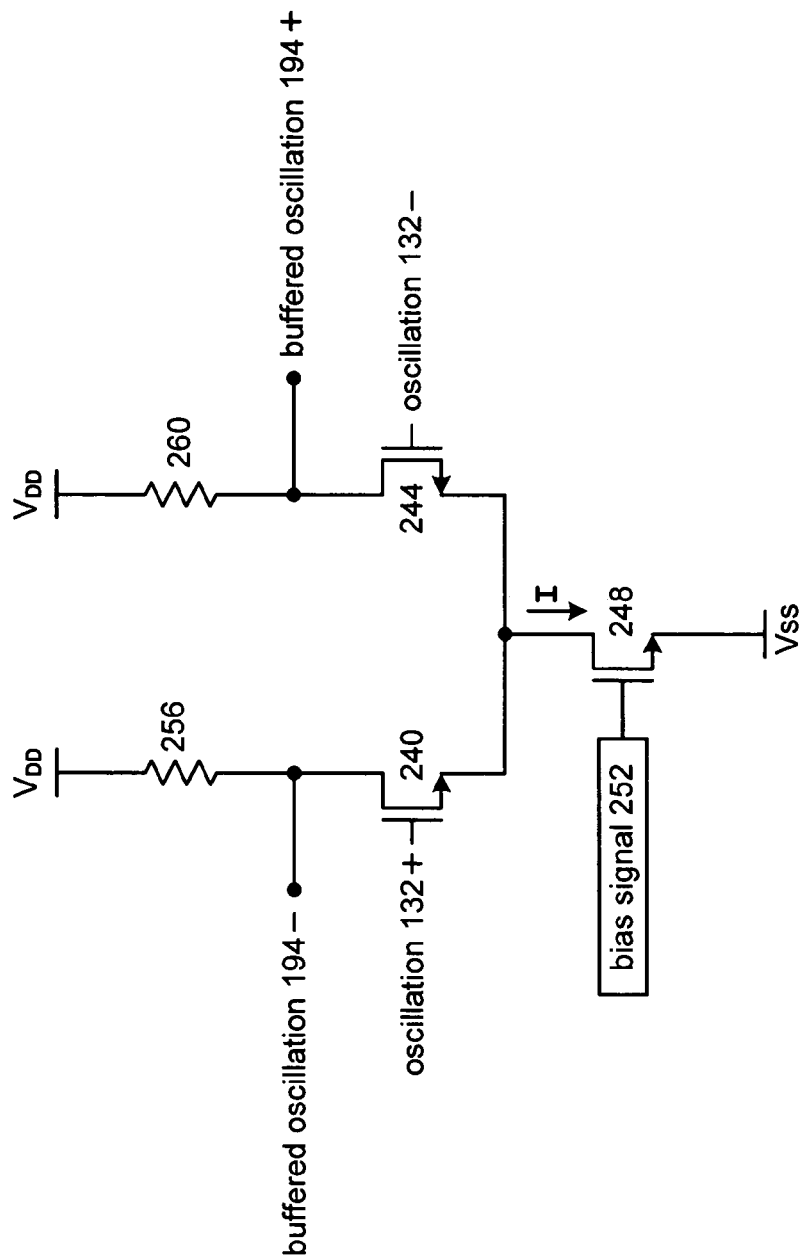
FIG. 7 is a schematic block diagram of a buffer according to one embodiment of the present invention.

FIG. 7 is a schematic block diagram of buffer 192 according to one embodiment of the present invention. Buffer 192 comprises a differential pair including transistor 240 and transistor 244, having commonly coupled sources further coupled to a bias transistor 248. Bias transistor 248 is coupled to receive a bias signal 252 coupled to a gate, wherein bias signal 252 biases transistor 248 to set a specified current in transistors 240 and 244. The drains of transistors 240 and 244 are further coupled to resistive elements 256 and 260, respectively, further coupled to a supply ($V_{DD}$). The differential pair comprising transistors 240 and 244 is formed to have a very small input capacitance thereby reducing the capacitive loading on oscillation 132 received from the VCO (VCO 108 of FIG. 5). Resistive elements 256 and 260 are formed to provide the desired voltage swing at the outputs of buffer 192, namely, buffered oscillation+ and buffered oscillation−, to achieve the voltage swing required by the dividers and latches coupled to the output of buffer 192. As is known to one of average skill in the art, having a low input capacitance allows oscillation 132 to rapidly change states due to the low RC time constant of buffer 192.

Figure 8:
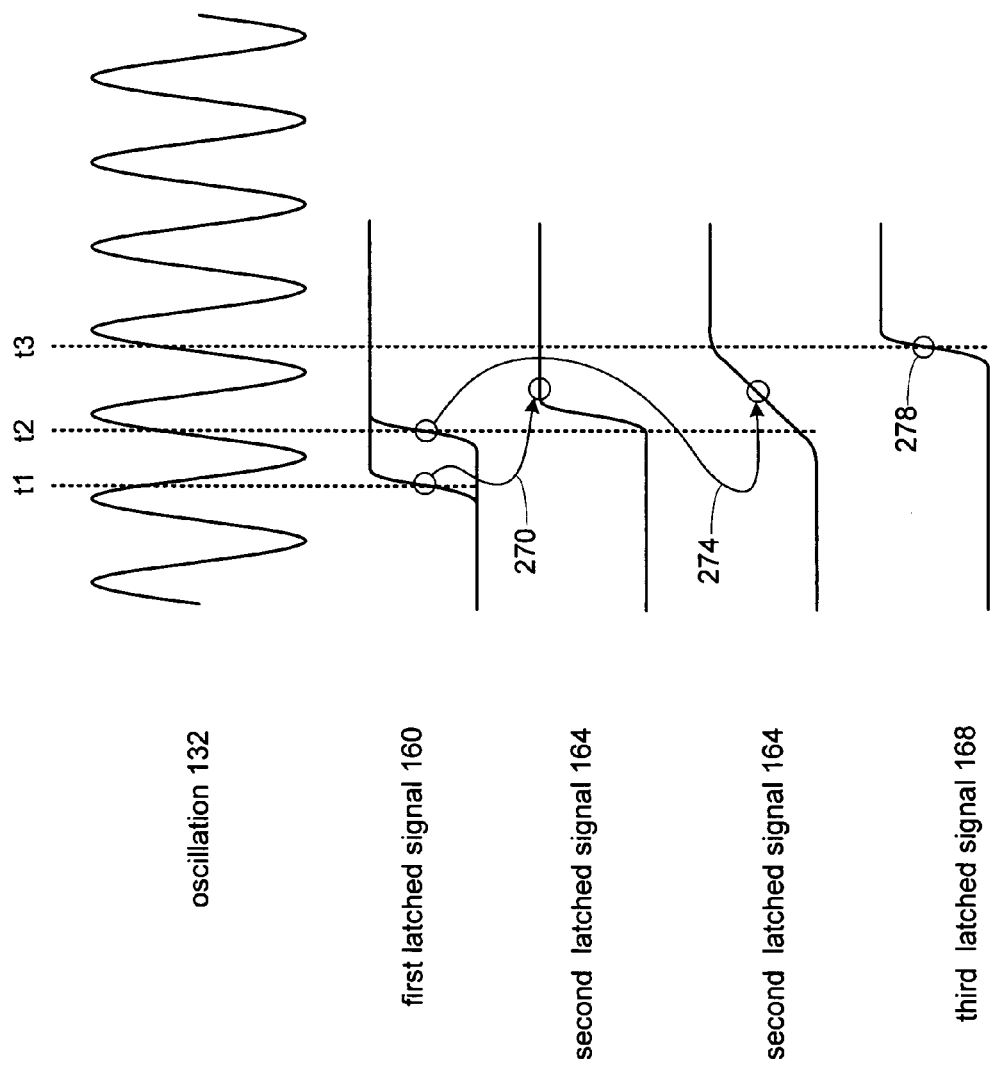
FIG. 8 is a graphical illustration of timing relationships according to one embodiment of the present invention.

FIG. 8 is a graphical illustration of timing relationships according to one embodiment of the present invention for a PLL formed according to the exemplary embodiment of FIG. 3. As can be seen, the graph illustrates oscillation 132, first latched signal 160 produced by first latching block 120 of FIG. 3, second latched signal 164 produced by second latching block 124 of FIG. 3, and third latched signal 168 produced by third latching block 128 of FIG. 3. When first latched signal 160 arrives, as shown by timing line t1, at the input of second latching block 124 (not shown) before the rising edge of oscillation 132, as illustrated by timing line t2, second latched signal 164 has a fast rise time that reaches its steady state value, illustrated by timing line 270, before the next rising edge of oscillation 132, as illustrated by timing line t3. Accordingly, third latched signal 168 will transition on the next rising edge of oscillation 132 as illustrated by timing lines t3 and 278. If, however, first latched signal 160 arrives very close to the rising edge of oscillation 132, as illustrated by timing line t2, the concurrent switching of the transistors operably coupled to receive second latched signal 164 and oscillation 132 causes second latched signal 164 to have a slow rise time, as illustrated by timing line 274. This slow rise time increases third latching block 128 of FIG. 4 susceptibility to coupled noise. One aspect of the present invention is to reduce the noise coupled to the divided output. This is achieved by re-timing the second latched block and the third latched block with oscillation 132, thus ensuring a full one cycle delay, which helps ensure the input signals have reached their final steady state value before the arrival of oscillation 132.

Figure 9:
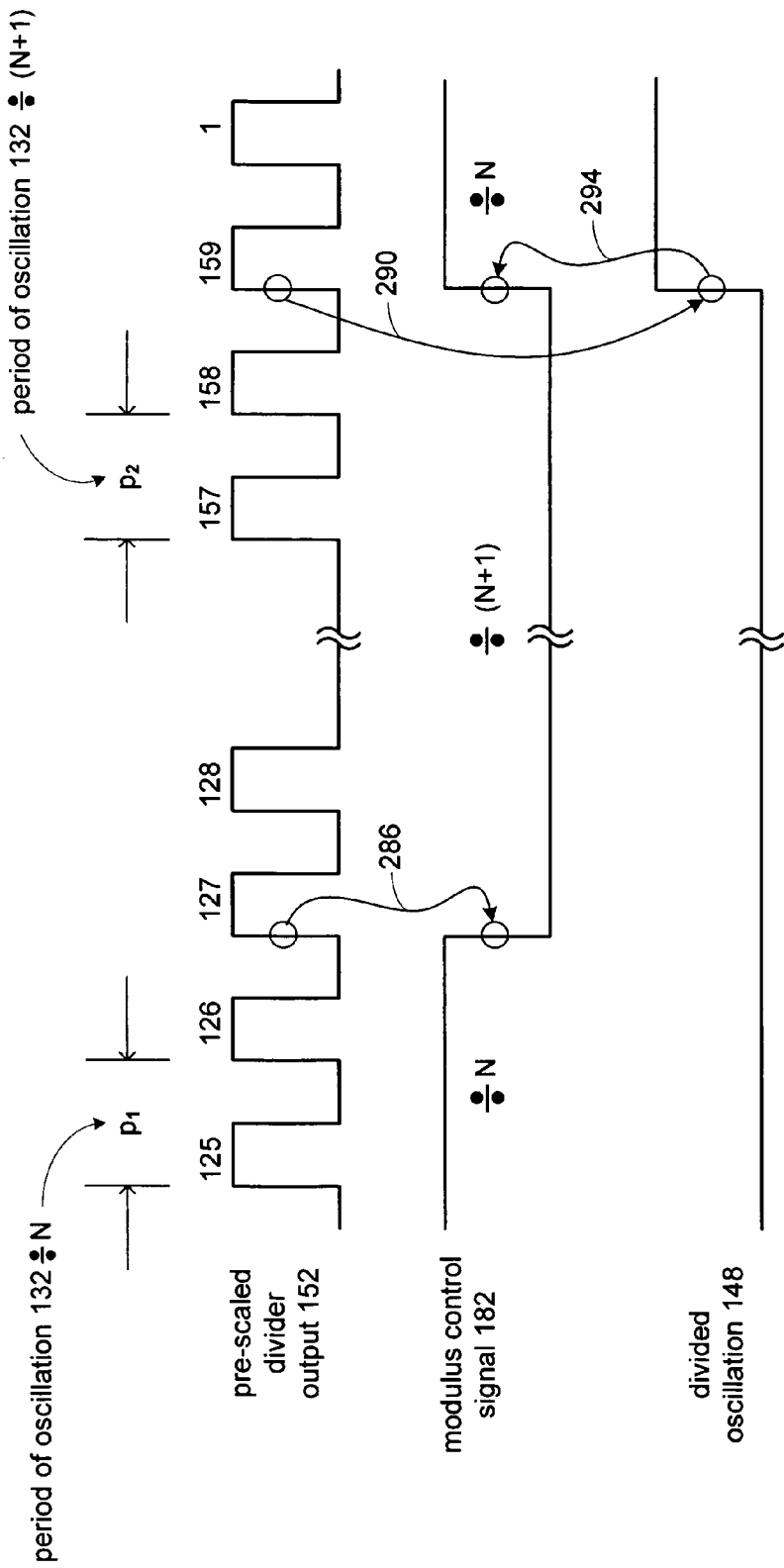
FIG. 9 is a graphical illustration of divided signals according to one embodiment of the present invention.

FIG. 9 is a graphical illustration of divided signals according to one embodiment of the present invention. Pre-scaled divider output 152 and divided oscillation 148 represent the two outputs of the pulse-swallow configured divider module 116 of FIG. 3. Pre-scaled divider output 152 represents oscillation 132 divided by N or by N+1 according to a modulus control signal 182. Pre-scaled divider output 152 is coupled to a program counter and to a swallow counter as was described with respect to FIG. 4. In the example of FIG. 9, the swallow counter has been configured to divide by 127 (select channel 127). On the rising edge of pulse 127, as can be seen by timing line 286, the swallow counter resets modulus control signal 182, which switches the pre-scaled divider from divide by N+1 to divide by N. In one embodiment of the present invention, N is 15. Pre-scaled divider output 152, as was previously mentioned, is coupled to a program counter wherein the program counter divides by P, wherein P is an integer. In one embodiment of the present invention, the program counter is configured as a divide by 159, i.e. P=159.

As can be seen in FIG. 9, on the rising edge of pulse 159, the program counter produces divided oscillation 148 rising edge, illustrated by timing line 290. Additionally, divided oscillation 148 is coupled to the reset input of the swallow counter, thus resetting the swallow counter which starts counting up to 127. Timing line 294 illustrates the rising edge of divided oscillation 148 resetting the swallow counter to switch from divide by N back to divide by N+1. As can be further seen in FIG. 9, the period of pre-scaled divider output 152 when dividing by N is simply the period of oscillation 132 divided by N+1 as illustrated by period P1. As can be further seen, when dividing by N, the period P2 is equal to the oscillation 132 divided by N. The frequency of divided oscillation 148, which is coupled to PFD 102 as the low phase noise divided oscillation, is determined by the amount of time the pulse-swallow configured divider module 116 divides oscillation 132 by N and N+1. In one embodiment of the present invention, the frequency of divided oscillation 148 can be represented mathematically as (frequency of oscillation 132)/(N*P+S+2). Thus, in one embodiment of the present invention where N is equal to 15, P is equal to 159, and S is equal to the program channel number, the divided oscillation 148 frequency will be equal to (frequency of oscillation 132)/(2387+S), where S is a channel number from 0 to 127. Continuing with the example of one embodiment of the present invention, the input to the pulse-swallow configured divider module 116 will have a frequency range of 1.6 GHz to 1.667 MHz and the frequency of divided oscillation 148 will be approximately 667 kHz.

Figure 10A:
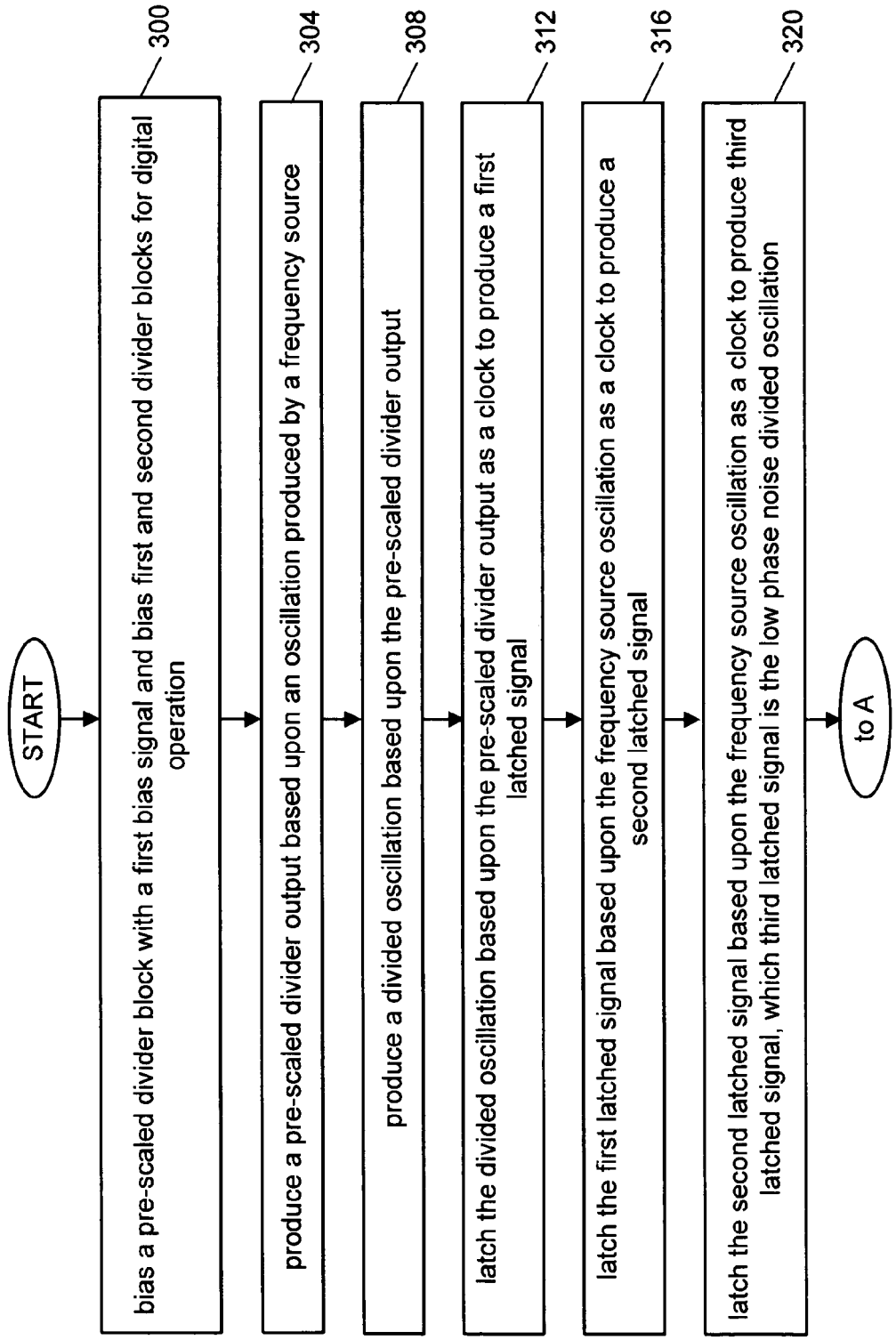
FIGS. 10A and 10B are flowcharts illustrating a method for producing a low phase noise divided oscillation according to one embodiment of the present invention.
Figure 10B:
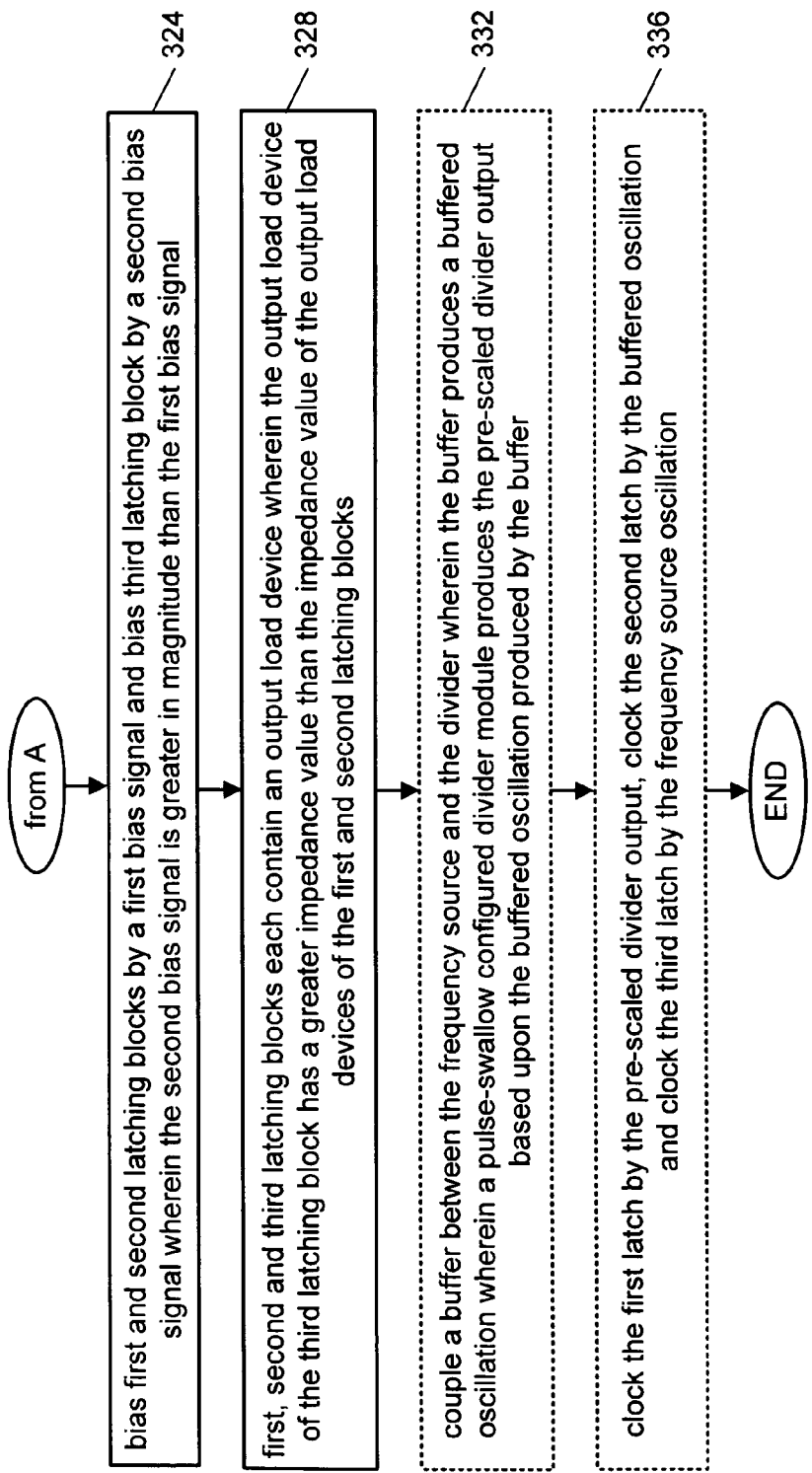

FIGS. 10A and 10B are flowcharts illustrating a method for producing a low phase noise divided output according to one embodiment of the present invention. Referring now to FIG. 10A, the method includes the steps of biasing a pre-scaled divider block with a first bias signal and biasing first and second divider blocks for digital operation (step 300). The first and second divider blocks are digital devices and, as such, do not require a static DC bias current. The pre-scaled divider block is an analog device, thus it requires the first bias signal for proper operation. Thereafter, in a pre-scaled divider, produce a pre-scaled divider output based upon an oscillation produced by a frequency source (step 304). The pre-scaled divider output represents the oscillation divided by one of N and N+1. In one embodiment of the present invention, N is equal 15 therefore the oscillation is alternately divided by 15 and 16. The method further includes the step of producing a divided oscillation based upon the pre-scaled divider output (step 308). Thereafter, the method provides for latching the divided oscillation based upon the pre-scaled divider output as a clock to produce a first latched signal (step 312), wherein the first latched signal is latched based upon the frequency source oscillation as a clock to produce a second latched signal (step 316). Thereafter, the method includes latching the second latched signal based upon the frequency source oscillation as a clock to produce third latched signal, which third latched signal is the low phase noise divided oscillation (step 320).

One aspect of the present invention is to select one bias signal to reduce noise and to select another bias signal to produce a desired output signal swing. Accordingly, as described with reference to FIG. 10B, the method includes biasing the first and second latching blocks by a first bias signal and biasing the third latching block by a second bias signal wherein the second bias signal is greater in magnitude than the first bias signal (step 324). First, second and third latching blocks each contain an output load device wherein the output load device of the third latching block has a smaller impedance value than the impedance value of the output load devices of the first and second latching blocks (step 328). In one embodiment of the present invention, a buffer is coupled between the frequency source and the divider wherein the buffer produces a buffered oscillation and wherein a pulse-swallow configured divider module produces the pre-scaled divider output based upon the buffered oscillation produced by the buffer (step 332), and clocking the first latching block by the pre-scaled divider output, clocking the second latching block by the buffered oscillation and clocking the third latching block by the frequency source oscillation (step 336).

Figure 11:
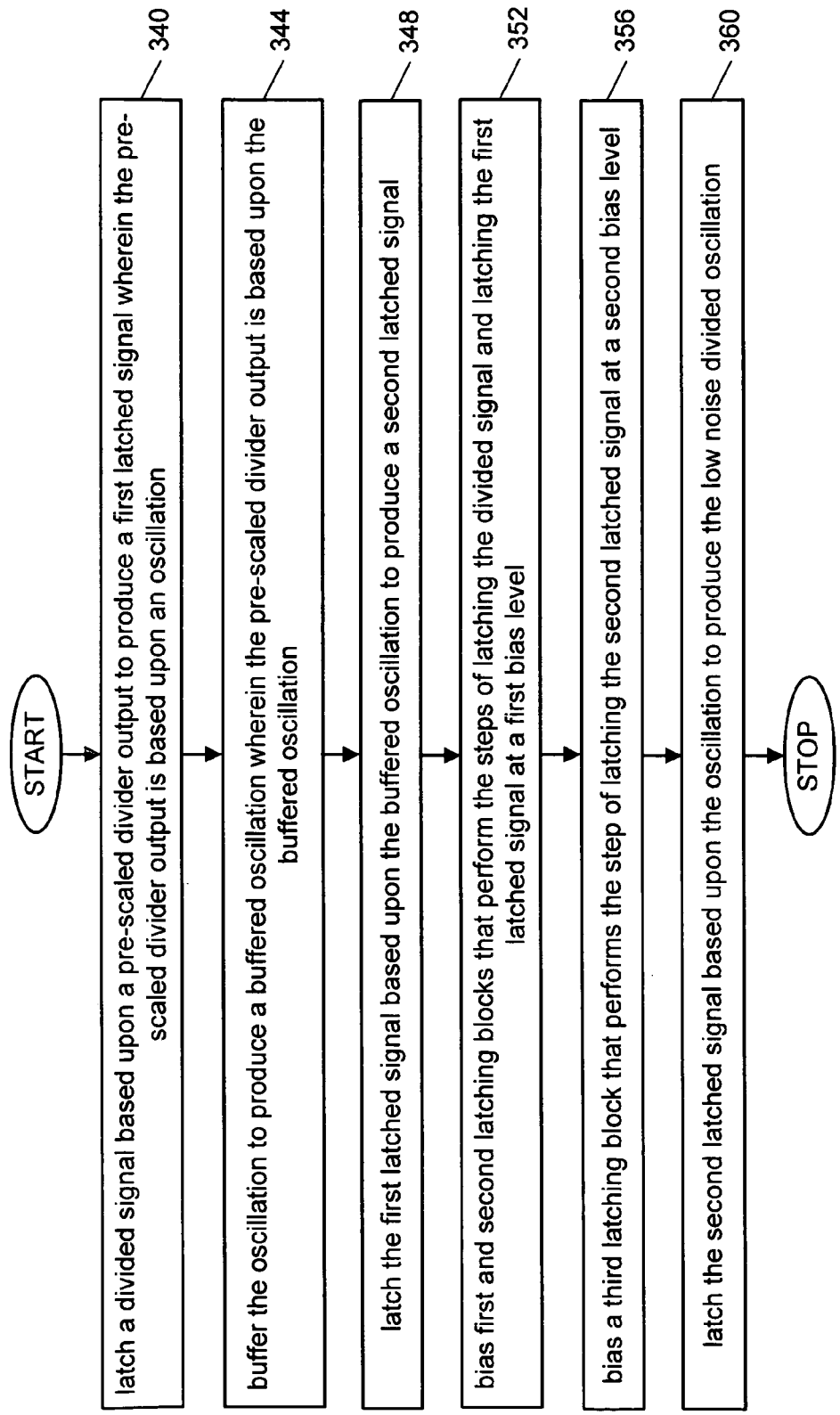
FIG. 11 is a flowchart of a method for producing a low-noise divided oscillation according to one embodiment of the present invention.

FIG. 11 is a flowchart of a method for producing a low-noise divided oscillation according to one embodiment of the present invention. A VCO produces an oscillation to be used as a local oscillation in a plurality of modules, such as local oscillation module 74 of FIG. 2. The VCO is typically configured in a phase locked loop wherein the VCO oscillation is, after frequency division, compared to a reference signal. The VCO oscillation frequency is adjusted to substantially phase align the VCO oscillation with the reference signal. In one embodiment of the present invention, a pulse-swallow configured divider module produces two divider outputs wherein each divider output represents a different division ratio of the VCO oscillation. The method latches a divided signal based upon a pre-scaled divider output to produce a first latched signal wherein the pre-scaled divider output is based upon an oscillation (step 340) received from the VCO.

In one embodiment of the present invention, a buffer is coupled between the VCO and the pulse-swallow configured divider to reduce the capacitive loading on the VCO. The oscillation produced by the VCO is operably coupled to buffer the oscillation to produce a buffered oscillation wherein the pre-scaled divider output is based upon the buffered oscillation (step 344) coupled to program counter as a clock. Thereafter, the method includes latching the first latched signal based upon the oscillation to produce a second latched signal (step 348). In order to reduce noise, the method includes biasing the first and second latching blocks that perform the steps of latching the divided signal and latching the first latched signal at a first bias level (step 352). Additionally, the method biases a third latching block that performs the step of latching the second latched signal at a second bias level (step 356). The first bias level has a smaller magnitude than the second bias signal. The second bias signal magnitude is selected to produce a desired output signal swing across a specified output load device, i.e., a resistive element, based on the signal level requirements of the device coupled to receive the low noise oscillation.

Accordingly, the method further includes, latching the second latched signal. based upon the oscillation to produce the low noise divided oscillation (step 360). The first, second, and third latching blocks clocked by essentially different phases of the oscillation functions to re-synchronize the divided oscillation with the VCO oscillation in order to substantially eliminate propagation delay introduced by the dividing circuits. Propagation delay would introduce a variation in the divided oscillation coupled to the phase-frequency detector thereby introducing a variation in the correction signal to the VCO thereby causing a variation in the VCO oscillation. This variation, or frequency instability, constitutes frequency domain phase noise that will be coupled to other circuits introducing clock or timing jitter into the digital circuits. Thus, the method of the present invention substantially reduces phase noise by producing the low-noise divided clock.

As one of average skill in the art will appreciate, the term "substantially" or "approximately", as may be used herein, provides an industry-accepted tolerance to its corresponding term. Such an industry-accepted tolerance ranges from less than 1% to 20% and corresponds to, but is not limited to, component values, integrated circuit process variations, temperature variations, rise and fall times, and/or thermal noise. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "operably coupled". As one of average skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The invention disclosed herein is susceptible to various modifications and alternative forms. Specific embodiments therefore have been shown by way of example in the drawings and detailed description. It should be understood, however, that the drawings and detailed description thereto are not intended to limit the invention to the particular form disclosed, but on the contrary, the invention is to cover all modifications, equivalents and alternatives falling within the spirit and scope of the present invention as defined by the claims.

The invention claimed is:

1. A phase-locked loop, comprising:
    a phase-frequency detector coupled to receive a reference signal, wherein the phase-frequency detector produces a phase control signal based upon a difference in phase between the reference signal and a low noise divided signal;
    a charge pump for producing a voltage controlled oscillator (VCO) control signal based upon the phase control signal;
    a VCO for producing an oscillation having a frequency based upon the VCO control signal; and
    a low-noise divider for producing the low phase noise divided oscillation, wherein the low-noise divider further includes:
        a pulse-swallow configured divider module for producing a pre-scaled divider output and a divided oscillation based upon the oscillation produced by the VCO;
        a first latching block for latching the divided oscillation based upon the pre-scaled divider output as a clock to produce a first latched signal;
        a second latching block for latching the first latched signal based upon the VCO oscillation as a clock to produce a second latched signal; and
        a third latching block for latching the second latched signal based upon the VCO oscillation as a clock to produce a third latched signal, which third latched signal is the low phase noise divided oscillation and is produced to the phase-frequency detector for comparison to the reference signal.

2. The phase-locked loop of claim 1 wherein the first and second latching blocks are biased by a first bias signal and wherein the third latching block is biased by a second bias signal.

3. The phase-locked loop of claim 2 wherein the second bias signal is greater in magnitude than the first bias signal.

4. The phase-locked loop of claim 3 wherein the first, second and third latching blocks each contain an output load device and wherein the output load device of the third latching block has a smaller impedance than an impedance of the output load devices of the first and second latching blocks.

5. The phase-locked loop of claim 1 wherein the pulse-swallow configured divider further includes a pre-scaled divider block and first and second divider blocks wherein the pre-scaled divider block is biased by a first bias signal and wherein the first and second divider blocks are biased for digital operation.

6. The phase-locked loop of claim 5 wherein the first and second latching blocks are biased by the first bias signal and wherein the third latching block is biased by a second bias signal.

7. The phase-locked loop of claim 6 wherein the second bias signal is greater than the first bias signal.

8. The phase-locked loop of claim 1 further including a buffer coupled between the VCO and the low-noise divider wherein the buffer produces a buffered oscillation and wherein the pulse-swallow configured divider module produces the pre-scaled divider output based upon the buffered oscillation produced by the buffer.

9. The phase-locked loop of claim 8 wherein the third latching block is clocked by the VCO oscillation and the second latching block is clocked by the buffered oscillation.

10. A divider for producing a low phase noise divided oscillation, comprising:
    a pulse-swallow configured divider module for producing a pre-scaled divider output and a divided oscillation based upon the oscillation produced by a frequency source;
    a first latching block for latching the divided oscillation based upon the pre-scaled divider output as a clock to produce a first latched signal;
    a second latching block for latching the first latched signal based upon the frequency source oscillation as a clock to produce a second latched signal; and
    a third latching block for latching the second latched signal based upon the frequency source oscillation as a clock to produce a third latched signal, which third latched signal is the low phase noise divided oscillation.

11. The divider of claim 10 wherein the first and second latching blocks are biased by a first bias signal and wherein the third latching block is biased by a second bias signal, which second bias signal is greater in magnitude than the first bias signal.

12. The divider of claim 11 wherein the first latching block is clocked by the pre-scaled divider output and wherein the third latching block is clocked by the low phase noise oscillation.

13. The divider of claim 12 wherein the first, second and third latching blocks each contain an output load device wherein the output load device of the third latching block has a smaller impedance value than the impedance value of the first and second latching block output load devices.

14. The divider of claim 10 wherein the pulse-swallow configured divider module further includes a pre-scaled divider block and first and second divider blocks wherein the pre-scaled divider block is biased by the first bias signal.

15. The divider of claim 14 wherein the second bias signal is greater than the first bias signal.

16. The divider of claim 10 further including a buffer coupled between the frequency source and the divider wherein the buffer produces a buffered oscillation wherein the pulse-swallow configured divider module produces the pre-scaled divider output based upon the buffered oscillation produced by the frequency source.

17. The divider of claim 16 wherein the third latching block is clocked by the frequency source oscillation and the second latching block is clocked by the buffered oscillation.

18. A method for producing a low phase noise divided oscillation, comprising:
  producing a pre-scaled divider output and a divided oscillation based upon an oscillation produced by a frequency source;
  latching the divided oscillation based upon the pre-scaled divider output as a clock to produce a first latched signal;
  latching the first latched signal based upon the frequency source oscillation as a clock to produce a second latched signal; and
  latching the second latched signal based upon the frequency source oscillation as a clock to produce a third latched signal, which third latched signal is the low phase noise divided oscillation.

19. The method of claim 18 wherein first and second latching blocks are biased by a first bias signal and wherein a third latching block is biased by a second bias signal.

20. The method of claim 19 wherein the second bias signal is greater in magnitude than the first bias signal.

21. The method of claim 20 wherein the first, second and third latching blocks each contain an output load device and wherein the output load device of the third latching block has a smaller impedance value than the impedance value of the output load devices of the first and second latching blocks.

22. The method of claim 18 wherein a pulse-swallow configured divider module further includes a pre-scaled divider block and first and second divider blocks wherein the pre-scaled divider block is biased by a first bias.

23. The method of claim 22 wherein the second bias signal is greater than the first bias signal.

24. The method of claim 18 further including a buffer coupled between the frequency source and a divider wherein the buffer produces a buffered oscillation wherein a pulse-swallow configured divider module produces the pre-scaled divider output based upon the buffered oscillation produced by the buffer.

25. The method of claim 24 wherein a first latching block is clocked by the pre-scaled divider output and a second latching block is clocked by the buffered oscillation and a third latching block is clocked by the frequency source oscillation.

26. A method for producing a low-noise divided oscillation, comprising:
  latching a divided signal based upon a pre-scaled divider output to produce a first latched signal wherein the pre-scaled divider output is based upon an oscillation;
  latching the first latched signal based upon the oscillation to produce a second latched signal;
  latching the second latched signal based upon the oscillation to produce the low-noise divided oscillation;
  biasing first and second latching blocks that perform the steps of latching the divided signal and latching the first latched signal at a first bias level; and
  biasing a third latching block that performs the step of latching the second latched signal at a second bias level.

27. The method of claim 26 further including buffering the oscillation to produce a buffered oscillation wherein the pre-scaled divider output is based upon the buffered oscillation and further wherein the step of latching the first latched signal is based upon the buffered oscillation.

28. A divider for producing a low phase noise divided oscillation, comprising:
  a multi-modulus divider module for producing a divided oscillation based upon an oscillation produced by a frequency source and a modulus control signal;
  a first latching block for latching the divided oscillation based upon a pre-scaled divider output as a clock to produce a first latched signal;
  a second latching block for latching the first latched signal based upon the frequency source oscillation as a clock to produce a second latched signal, which second latched signal is the low phase noise divided oscillation;
  wherein the first and second latching blocks are biased by a first bias signal and further including a third latching block wherein the third latching block is biased by a second bias signal, which second bias signal is greater in magnitude than the first bias signal; and
  wherein the first and second latching blocks each contain an output load device wherein the output load device of the second latching block has a smaller impedance value than the impedance value of the first latching block output load device.

29. The divider of claim 28 wherein the multi-modulus divider module further includes a plurality of divider blocks operably coupled to produce the divided oscillation based on the modulus control signal and the frequency source oscillation divided by at least one of a first divisor and a second divisor.

30. The divider of claim 28 further including a buffer coupled between the frequency source and the multi-modulus divider module wherein the buffer produces a buffered oscillation wherein the multi-modulus divider module produces the divided oscillation output based upon the buffered oscillation produced by buffer.

31. The divider of claim 30 wherein the second latching block is clocked by the buffered oscillation.

* * * * *